(12) United States Patent
Avendano et al.

(10) Patent No.: US 8,750,538 B2
(45) Date of Patent: Jun. 10, 2014

(54) METHOD FOR ENHANCING AUDIO SIGNALS

(75) Inventors: Carlos Avendano, Campbell, CA (US);
Jean Laroche, Santa Cruz, CA (US);
Michael M. Goodwin, Scotts Valley, CA (US)

(73) Assignee: Creative Technology Ltd, Singapore (SG)

(*) Notice: Subject to any disclaimer, the term of this patent is extended or adjusted under 35 U.S.C. 154(b) by 1746 days.

(21) Appl. No.: 11/744,465

(22) Filed: May 4, 2007

(65) Prior Publication Data
US 2007/0258603 A1 Nov. 8, 2007

Related U.S. Application Data

(60) Provisional application No. 60/746,625, filed on May 5, 2006.

(51) Int. Cl.
*H03G 3/00* (2006.01)
*H03G 9/00* (2006.01)
*H03G 5/00* (2006.01)
*H04B 15/00* (2006.01)

(52) U.S. Cl.
USPC ........... 381/107; 381/94.8; 381/102; 381/103

(58) Field of Classification Search
CPC ............. H03G 3/00; H03G 5/00; H03G 7/00; H03G 3/3005; H03G 3/301; H03G 7/002; H03G 5/18
USPC ......... 381/107, 102, 103, 106, 61, 94.8, 94.5; 700/94

See application file for complete search history.

(56) References Cited

U.S. PATENT DOCUMENTS 5,172,358 A * 12/1992 Kimura ................. 369/47.26
2004/0234079 A1 * 11/2004 Schneider et al. .............. 381/58

* cited by examiner

*Primary Examiner* — Vivian Chin
*Assistant Examiner* — Douglas Suthers
(74) *Attorney, Agent, or Firm* — Russell Swerdon; Desmund Gean

(57) ABSTRACT

A frequency band of an audio input signal is analyzed to determine if a transient is present. When transients are detected, modifications are made to the intensity levels corresponding to the frequency band for a brief time period.

20 Claims, 4 Drawing Sheets

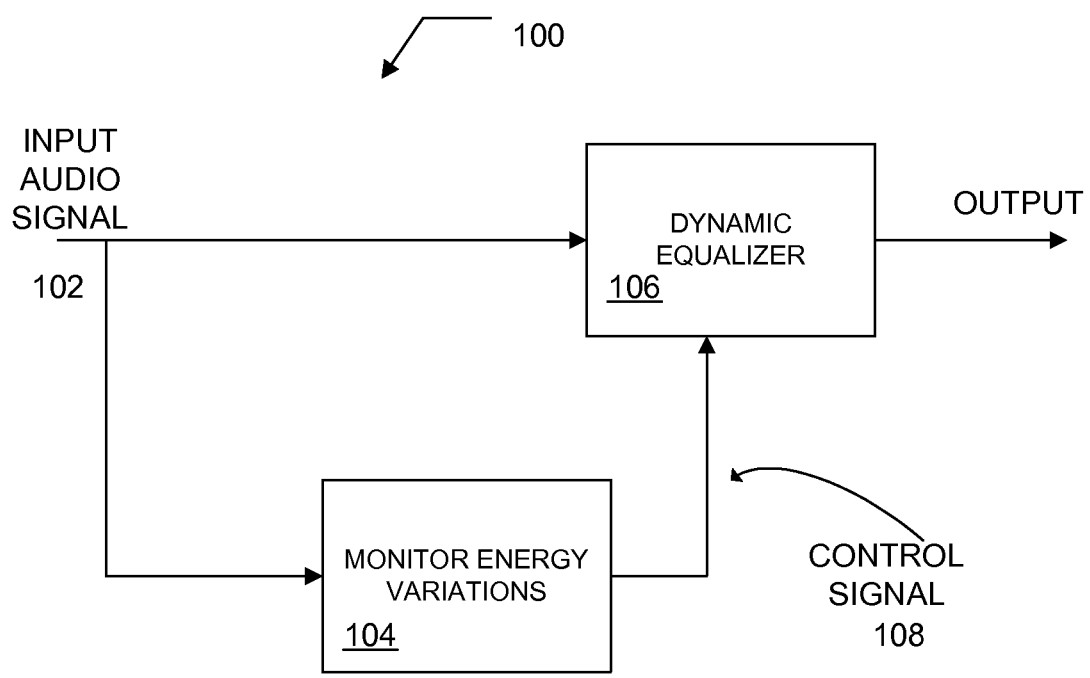
Fig._1

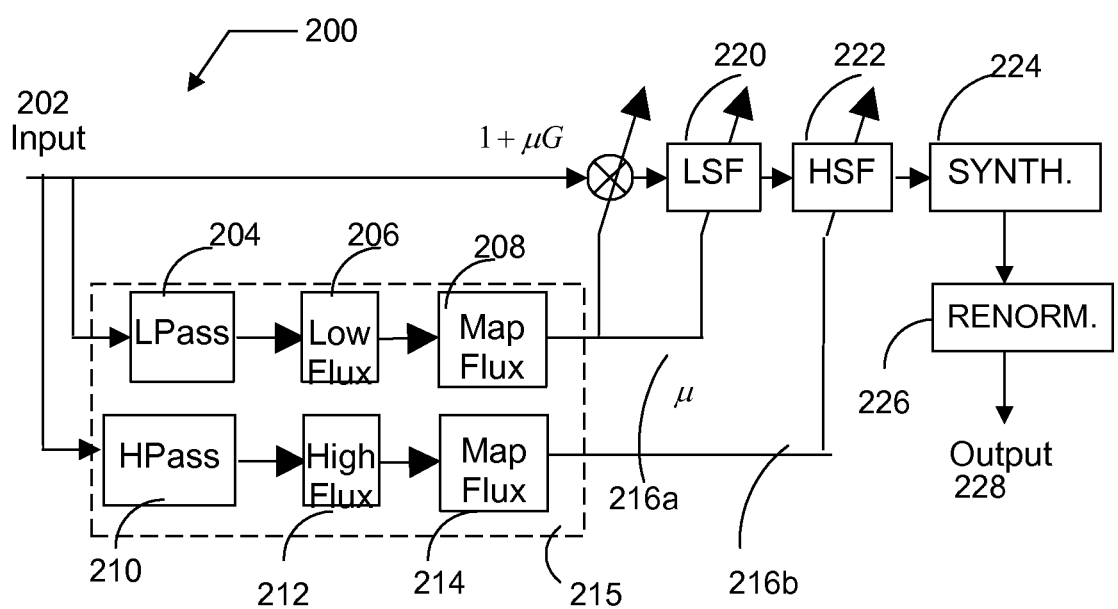
Fig._2

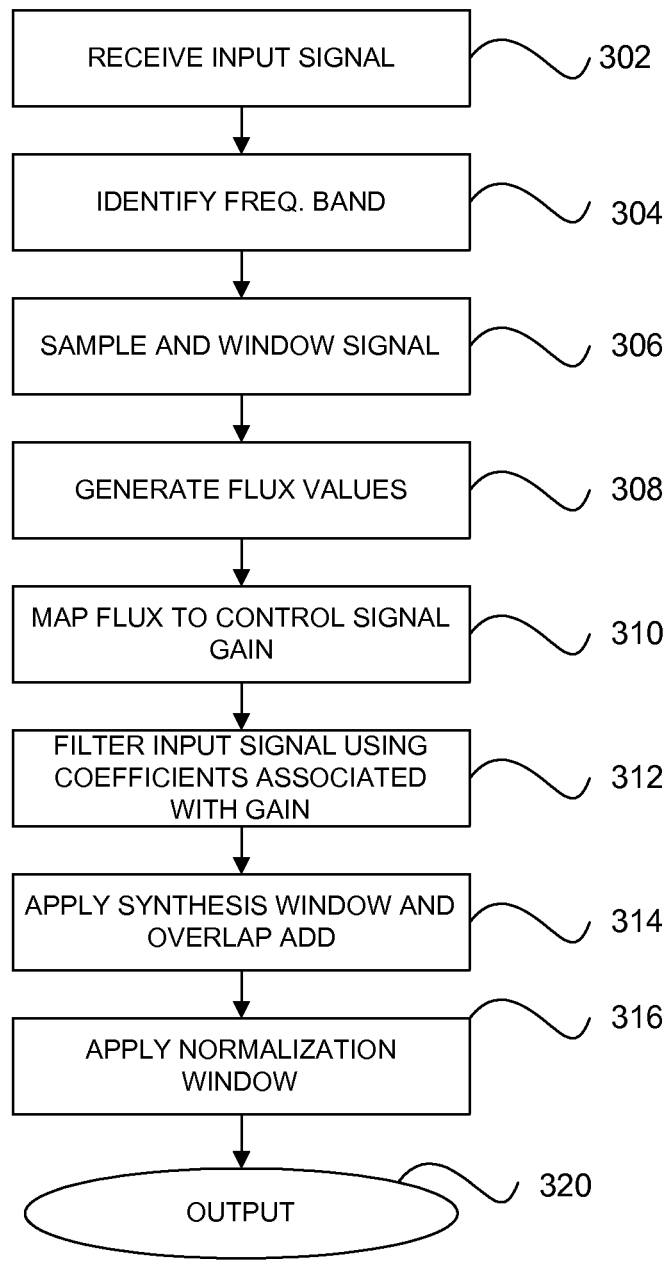
Fig._3

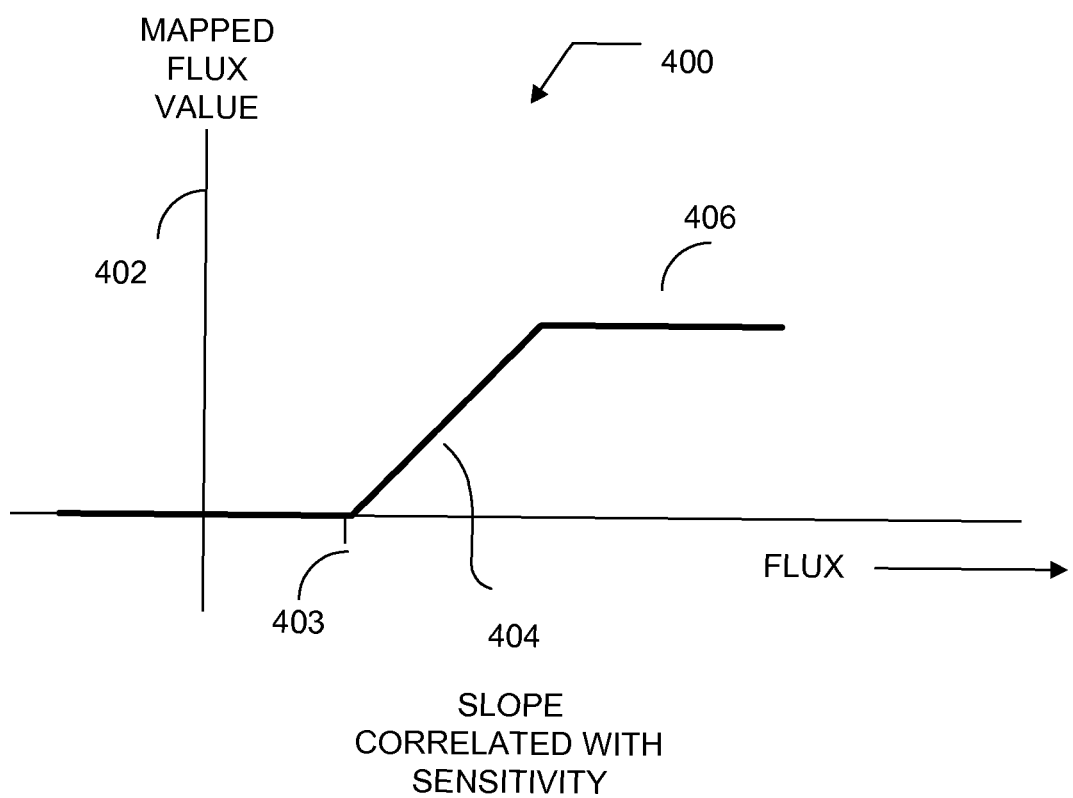
Fig._4

METHOD FOR ENHANCING AUDIO SIGNALS

CROSS-REFERENCES TO RELATED APPLICATIONS

This application claims priority of provisional U.S. Patent Application Ser. No. 60/746,625, filed May 5, 2006, titled "Method for Enhancing Audio Signals" the disclosure of which is incorporated by reference in its entirety.

FIELD OF THE INVENTION

The present invention relates to audio signal processing. More particularly, the present invention relates to enhancing selected portions of an audio signal in response to detected characteristics of the signal.

BACKGROUND OF THE INVENTION

Audio signals or streams typically may be rendered to a listener, such as by using a speaker to provide an audible rendering of the audio signal or stream. An audio signal or stream so rendered may have one or more characteristics that may be perceived and, in some cases, identified and/or described by a discerning listener. For example, a listener may be able to detect how sharply or clearly transient audio events, such as a drumstick hitting a drum, are rendered.

Different audio playback equipment presents different rendering characteristics. For example, "high end" audio equipment may render audio in a different manner than lower cost audio equipment. In the former case, the audio signals may be rendered in a way that permits audio characteristics such as transient audio events to be perceived to a greater extent than from the use of less expensive audio equipment.

Different listeners may have different preferences and/or tastes with respect to such identifiable perceptual characteristics. One listener may prefer that transient audio events, such as drum hits, be enhanced or otherwise emphasized, whereas another might instead prefer that such transient events be suppressed to some extent or otherwise de-emphasized. In addition, an individual listener may prefer that such transients be enhanced for certain types of audio data (e.g., rock music), and suppressed or softened to a degree for other types (e.g., classical music or non-music recordings).

It is therefore desirable to provide improved control over transients and other characteristics in an audio stream.

SUMMARY OF THE INVENTION

The present invention provides a method for enhancing the characteristics of an audio signal. An input audio signal is filtered into at least one frequency band and decomposed into a sequence of frames, each frame corresponding to a group of samples from the segmented signal. A flux value is determined for each frame and a sequence of flux values generated. In one embodiment, the flux value corresponds to the RMS value of the frame or portion of the frame examined. The sequence of flux values is analyzed to determine a first order energy level variation exceeding a threshold. Where there exists a rapid change in flux values, a corresponding portion of the signal is briefly enhanced.

In accordance with one embodiment, a method of enhancing an audio signal is provided. A sequence of flux values is derived from the input signal. The method comprises monitoring the energy level variations in at least one frequency band of the audio signal and applying a dynamic time varying equalizer to the audio signal based on the monitored energy level variations. In one embodiment, monitoring the energy level variations comprises decomposing the audio signal into a sequence of frames, each frame having at least one sampled value and assigning an energy level for each frame in the sequence.

These and other features and advantages of the present invention are described below with reference to the drawings.

BRIEF DESCRIPTION OF THE DRAWINGS

FIG. 1 is a block diagram illustrating a system and method for dynamically enhancing an audio signal in accordance with one embodiment of the present invention.

FIG. 2 is a block diagram illustrating a system for enhancing an audio signal in accordance with one embodiment of the present invention.

FIG. 3 is a flow chart illustrating a method of enhancing an audio signal in accordance with one embodiment of the present invention.

FIG. 4 is a diagram illustrating a transfer function for mapping flux values to a control signal gain in accordance with one embodiment of the present invention.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known mechanisms have not been described in detail in order not to unnecessarily obscure the present invention.

It should be noted herein that throughout the various drawings like numerals refer to like parts. The various drawings illustrated and described herein are used to illustrate various features of the invention. To the extent that a particular feature is illustrated in one drawing and not another, except where otherwise indicated or where the structure inherently prohibits incorporation of the feature, it is to be understood that those features may be adapted to be included in the embodiments represented in the other figures, as if they were fully illustrated in those figures. Unless otherwise indicated, the drawings are not necessarily to scale. Any dimensions provided on the drawings are not intended to be limiting.

A method for dynamically enhancing audio is provided, for example, for selectively and dynamically expanding the dynamic range of the musical piece. In accordance with one embodiment, a static EQ is provided to statically enhance a low and high band in conjunction with the dynamic enhancement.

The dynamic enhancement portion monitors the input energy level of a frequency band and responds to rapid changes in flux values. That is, rapid changes in the energy (e.g., note onsets, percussion hits, transients) results in modifications to the gain applied to low and high pass filters to boost the energy level for a limited period of time from the detection of the rapid change. An example non-limiting time range for the modification or enhancement is from 20-50 ms., but the scope of the invention covers both shorter and longer time periods.

The changes in flux values drive the characteristics of the time-varying dynamic equalizer. Preferably, the analysis phase generates a control signal for control of the high and low pass filters, (e.g., dynamic shelving filters), positioned in series to modify the input audio signals. For example, when there exists a transient in the low frequencies, the mapping of the control signal causes a boost for the shelving filter in the low band. A similar effect occurs when transients or other energy level variations are detected within the high band.

FIG. 1 is a block diagram illustrating a system 100 and method for dynamically enhancing an audio signal in accordance with one embodiment of the present invention. An input audio signal 102 is monitored to detect energy level variations. In a preferred embodiment, the energy level variations are monitored using an analysis module 104 operating on a plurality of sampled values from the input audio signal. The analysis module includes an analysis window that splits the incoming signal into overlapping windows. Various types of analysis windows are known to those of skill in the arts and hence complete details will not be provided herein. Non limiting examples of suitable windows include rectangular windows and more preferably Hanning windows to avoid creation of discontinuities in the combined signal.

The analysis window quantizes the input audio signal into a sequence of frames, each frame comprising at least one sample. In one embodiment, each frame comprises a plurality of samples with the samples grouped sequentially and presented for further analysis using an overlap and add procedure. Overlap and add processing is known to those of skill in the relevant arts and hence complete details will not be provided herein. In one embodiment, each frame comprises 256 samples with sequential frames overlapping by 50%. In another embodiment, each frame comprises a single sample.

Flux values derived from the analysis window 104 are mapped to a control signal 108 (i.e., a mapped flux value) to adjust the characteristics of the dynamic equalizer 106. Hence, the dynamic equalizer 106 is driven by the signal itself. The analysis module 104 is configured to be responsive to variations in signal energy, for example, sensitive to changes in signal loudness. The control signal 108 provides continuous control of the processing filters comprising the dynamic equalizer 106 in order to provide an output signal selectively enhancing transients.

Further details regarding enhancement of an audio signal according to the method described above are illustrated in FIG. 2. FIG. 2 is a block diagram illustrating a system for enhancing an audio signal in accordance with one embodiment of the present invention. The illustrated system 200 shows flux generation occurring in block 215. Preferably the signal is split first into a low flux signal 206 using a low pass filter 204 and into a high flux signal 212 using first a high pass filter 210.

According to an alternative embodiment, a frame of duration N of the input signal 202 is pre-emphasized by applying a frequency band filter. Preferably separate frames for separate frequency bands are derived by applying a first order high-pass filter 210 and a second order low pass filter 204. The frames are then fed respectively to modules that compute LPC coefficients using the autocorrelation method and the Levinson-Durbin recursion formula. The LPC coefficients comprise a representation of the audio signal 202.

Turning back to a preferred embodiment, two energy flux signals (206 and 212) are first calculated from the original audio signal 202. These flux signals are designed to react respectively to low and high frequency transients and are subsequently used as control signals in the dynamic gain and EQ stages. An energy flux represents the variation in time of the short-term energy of the incoming signal in low and high frequency ranges. The normalized flux f is then mapped via a non-linear soft-decision function to create a control signal µ whose values vary, for a non-limiting example, from 0 to 0.5. An example transfer function is illustrated in FIG. 4.

The first energy flux reacts to very low frequency transients (typically kick drums), while the second one reacts to high-frequency transients (e.g., snare drums, and cymbals). Further details of an example embodiment for deriving the flux signals follow. Both flux signals are extracted from a "reference signal": For a monophonic incoming signal, the reference signal is the signal itself, for a stereo signal it is the sum of the two channels, and for a multichannel signal, it is the sum of the left, right and center channels.

The low-frequency flux signal 206 is derived from an approximation of the RMS value of a low-pass version of the reference signal. Preferably the low pass filter has a sharp cutoff. The lowpass filter 204 is in one variation a third-order Chebyshev filter with a cutoff of 750 Hz. The low-frequency flux signal controls a dynamic second-order low-shelving filter 220 and a dynamic gain stage.

The high-frequency flux signal 212 is derived from an approximation of the RMS value of a high-pass version of the incoming reference signal. The highpass filter 210 according to this embodiment is a third-order Chebyshev filter with a cutoff of 12000 Hz. Both flux signals are then normalized relative to the maximum of the reference signal over the analysis frame. This renders them independent of the level of the incoming signal. The result of this normalization is further compressed in one embodiment by a sqrt( ) function, to compensate for the flux signals having too large a dynamic range.

Both flux signals are subjected to a non-linear filter whereby the maximum flux value from past frames (from indexes −40 to −2 in terms of frames, for example) is subtracted from the current flux value. This is somewhat akin to a first-order difference, but helps emphasize strong increases even if they are not sudden (which is typically the case in the low frequency flux).

In this preferred embodiment, there are additional non-linearities applied to the flux signals. FIG. 4 is a diagram illustrating a transfer function for mapping flux values to a control signal gain in accordance with one embodiment of the present invention. Denoting f the flux signal (low or high frequency), the following non-linearities are applied:

$$f'=\max(0,f-f0)$$

$$f''=\min(f'*g,0.5)$$

where f0 represents a "floor" value, and g is a linear multiplicative factor. The result f" (the mapped flux value) is always between 0 and 0.5. This means that the flux signals 402 are clamped to 0 when they're below a floor value f0 (See reference number 403), a process which is intended to eliminate (usually noisy) values that are close to 0. The flux signals are also smoothed by standard first-order non-linear filters with a fast attack time and a slow release time. The slope 404 of the transfer function 400 illustrated in FIG. 4 corresponds to a sensitivity measure. Steeper slopes increase the sensitivity. Taken to an extreme value, a nearly vertical slope would tend to generate a binary treatment of the incoming flux. Hence, huge amplification would result from a flux value slightly above the threshold, whereas no amplification would result from input flux values having a slightly smaller magnitude. This would generate undesirable "pumping." One skilled in the art could alter the slope of the transfer function in appreciation of the tradeoffs present and to avoid such undesirable artifacts. The mapped flux value 402 is capped at a maximum value 406, here predetermined to be a value of 0.5.

Turning back to FIG. 2, preferably, respective control signals μ 216 (i.e., mapped flux values) are used to determine the gain for the low shelving filter 220 and high shelving filter 222. A low frequency mapped flux 216a ($\mu_{lp}$) and a high frequency mapped flux 216b ($\mu_{hp}$), (generated in Map Flux blocks 208 and 214) control respectively the gains for the low shelving filter 220 and high shelving filter 222. In one embodiment, the shelving filters 220 and 222 are $1^{st}$ order FIR shelving filters. In accordance with another embodiment, The low shelving filter 220 is a $2^{nd}$ order IIR filter and the high shelving filter 222 is a first order IIR filter. In one non-limiting embodiment, the low and high dynamic shelving filters (220, 222) are both IIR filters based on the Regalia-Mitra topology. The scope of the invention extends also to implementation with any other topology.

In this embodiment, the low-shelving filter 220 is a second order filter obtained by squaring a standard first-order Regalia-Mitra low-shelving filter having a gain denoted $G_{lp}$. The second-order filter has a gain denoted $G_{lp}^2$ at DC, and 1 at Nyquist. The high-shelving filter 222 is a first order Regalia-Mitra high-shelving filter with a gain denoted Ghp at Nyquist. There is no limit imposed on the DC and Nyquist gains, so clipping can occur.

The dynamic parameters Glp and Ghp are directly controlled by the low and high frequency flux signals using the following formula:

$$Glp = 1 + r\mu_{lp}$$

$$Ghp = 1 + r\mu_{hp}$$

where μ is the mapped flux signal ($\mu_{lp}$ is the low freq. mapped flux and $\mu_{hp}$ is the high freq. mapped flux) and r is an adjustable parameter, i.e., a "sensitivity" control. As a result, the square of the DC gain of the low-shelving filter is roughly proportional to the low-frequency flux signal, while the Nyquist gain of the high-shelving filter 222 is roughly proportional to the high-frequency flux signal.

The mapped flux signal (216a, 216b), i.e. a control signal, controls the gain that is applied by the second group of filters, i.e., filters 220 and 222. In a preferred embodiment, presets are used to preselect the applied slope and the thresholds, and hence affect the gain in the filters 220 and 222. Preset options may be presented to a user through a user interface and may comprise any combinations of effects. For example, in one embodiment, 4 presets are presented to the user. The Low preset corresponds to a mild effect. The difference between bypass/non-bypass will be barely noticeable on most tracks, but the presets might provide an impalpable general perceptual improvement of the audio. This would be the choice preset for someone who's keen on preserving the authenticity of their audio tracks, but would be interested in a slight overall improvement of the audio.

The Medium preset corresponds to a good balance between audibility of the effect, and naturalness. The effect will be noticeable yet not excessive on most tracks. Percussions will sound sharper, high-hats, cymbal hits will be crispier, kick drum and snare drum hits will be punchier, without sounding aggressive.

The High preset is intended to help demonstrate the effect of the audio enhancement processing. Exaggerating the modifications allows a user to better appreciate the audio enhancement capabilities. On most tracks, the effect will be very audible. Percussions will have a tendency to become aggressive on some tracks, kick drums almost abnormally loud and punchy. On some mellow tracks, this preset will provide very pleasant results, but on tracks that are already fairly punchy, the results will tend to be too aggressive.

The Game preset is recommended for game audio. This is the strongest preset, and preserving the original quality of the background music is not a primary goal. Rather, the emphasis is put on exaggerating audio effects such as explosions, shots etc. If this preset is used on regular audio tracks, the results will most likely sound unnatural. According to another embedment, a slider control is provided in a user interface to enable the user to vary the extent of the audio enhancement. The slider control preferably performs a linear interpolation on the gain parameters.

The output signal 228 is shown generated after Blocks 224 and 226 provide synthesis and renormalization functions respectively. Their functions will be described in greater detail below in the discussion regarding FIG. 3.

FIG. 3 is a flow chart illustrating a method of enhancing an audio signal in accordance with one embodiment of the present invention. Initially, an audio input signal is received in operation 302. Next, a frequency band is identified in operation 304 for analysis. Preferably, the identification of the frequency band involves at least a low frequency band and a high freq. band. Although detection of high and low-frequency transients and a subsequent engagement of a dynamic EQ to emphasize the corresponding frequency range are described, it should be understood that the invention is not limited to this example. The scope of the invention covers analysis techniques applied to any and all combinations of frequency ranges without limitation. Hence the scope of the invention includes but is not limited to analyses performed on 3 or more frequency bands as well as an analysis performed on a single freq. band. In the latter case, the single frequency band can comprise the entire frequency spectrum of the incoming audio signal.

Next, the frequency limited band is sampled and windowed (e.g., an analysis window applied) in operation 306. For example, a low pass filtered signal is segmented to generate a sequence of frames. For example, in one embodiment, the frame may comprise 256 samples. Preferably, the sampled values in the sequence of frames are grouped using an overlap and add procedure, more preferably using an overlap of 50%. It should be noted, however, that the scope of the invention is not so limited but rather extends to all variations of grouping the sampled data and including without limitation all overlap and add techniques and percentages of overlap, all variations of analysis windows applied to shape the frames, and all sizes of frames including analyses based on a sample by sample basis.

In this embodiment, the method is operative to respond to the occurrence of a transient (percussion hits, note onsets), to briefly engage a dynamic EQ that emphasizes the corresponding frequency range. The result, for example, can include an increased crispness of the high frequencies, more punchy mid-range percussions (snare drums, congas) and note onsets, and stronger kick bass hits. The technique is based in the time-domain rather than in the frequency-domain and hence has lower memory and computational requirements than frequency domain based analyses.

Next, in operation 308, flux values are generated. That is, for each analysis frame derived, a flux value is generated. As used herein, flux refers to and represents the change in energy between the successive frames in the plurality of frames derived in the preceding step. In order to determine the flux, an energy value is assigned to the frame or other sample grouping. Preferably the RMS value of signal is used to determine the energy levels. The method examines the way the energy level changes to generate a flux value for the frame. In one embodiment, applying something similar to a first order derivative, i.e., one frame less the previous frame, is performed to generate the flux value. More details as to the frame comparison are provided below. In order to determine the flux, only half (i.e., the most recent samples) of the frame are analyzed.

The flux correlates with transients. That is, the flux will yield a high energy level for the frame when a transient occurs for that frequency band under examination. For example, kick drums or cymbals will generate a transient and a corresponding peak in the flux.

Next, in operation 310 a mapped flux value is derived. A nonlinear function, such as illustrated in FIG. 4, will map that flux into a mapped flux value for generation of coefficient for the corresponding low shelving filter or high shelving filter. That is, for each separate frame, a mapped flux value is determined and provided as a control signal for controlling the coefficients and gain of the low and high shelf filters applied in series to the input audio signal.

In operation 312, the frequency limited filters are applied in series to windows of samples corresponding to the input audio signal. In a preferred embodiment, the frequency limited filters are low and high shelf filters. In another embodiment, the gain is applied to the entire signal instead of a selected frequency band. Preferably, transient enhancement or modification occurs through the continuous recomputation of coefficients for digital filters applied to the incoming audio signal. The coefficients for the filters are computed based on the supplied control signal(s). Methods for determining filter coefficients from gain values such as mapped flux values are known to those of skill in the relevant arts and hence complete details are not provided herein.

The filtering is a dynamic time varying process. In typical operation, the filter will remain constant over one frame and change for processing of the next frame. In a digital filter application, the coefficients are computed once per frame, applied to that frame of the input signal, and then recomputed based on a new mapped flux value derived from the next signal frame. In a preferred embodiment, the gain is determined so as to boost the input audio signal upon detection of a transient. Alternatively, in accordance with another embodiment, the signal can be made less percussive or punchy by attenuating the signal. In accordance with yet another embodiment, a mechanism is provided such that the user selects whether gain or attenuation is the response to transient detection.

Next, a synthesis window is applied in operation 314, followed by an overlap and add procedure to reconstitute the modified or enhanced audio signal. The synthesis window avoids discontinuities at the end of the window. Because the coefficients for both windows are not the same, i.e., the time varying filter will typically apply different coefficients to different frames, application of synthesis windows avoid undesirable artifacts (such as clicking). An overlap and add step follows to recombine the separate filtered windows or frames into the output audio signal.

Next, in operation 316, a normalization window is applied. This is desirable to avoid clipping of the output signal and to ensure that the output signal precisely mimics the input signal in portions of the input signal where no enhancement is desired or not implemented. For these unenhanced frames, the normalization window adjusts the output to match the input signal and is generally a function of the original shapes of the analysis windows used in operation 306.

In accordance with an alternative embodiment, the analysis and synthesis windows (operations 306 and 314 respectively) are selected to result in a unity gain (i.e., gain=1) such that a renormalization window need not be applied. The preferred embodiment, however, involves a renormalization window. This allows the user greater latitude in window selection and compensates for the window shape through the use of the renormalization window.

Finally, in operation 320 an enhanced audio signal is provided as the output signal.

In an alternative embodiment, the time varying filter performs a continuous filtering of the input signal by changing the coefficients on a sample by sample basis. Since the coefficients of the filter vary at each sample, the signal may be reconstituted without using an overlap add procedure operating on sequential frames. In one aspect, the transient detection operates on a frame or block of samples and derives a flux value for each sample by interpolating from the surrounding sample values (in the frame). The interpolated values are then used to modify the filter coefficients.

That is, according to alternative embodiments, flux values for sample by sample filtering are derived by 1) computing the flux on a frame basis and interpolate; or 2) computing the flux on a sample basis, having one value per sample. In the latter alternative, the instantaneous energy is computed on a sample basis followed by smoothing and determination of a first order difference.

The foregoing description describes several embodiments of a method for enhancing audio signals. A process is provided that is sensitive to variations in signal loudness rather than to signal loudness itself. While the embodiments describe details of audio content sources, the invention is not so limited but is intended to extend to all forms of media signals such as including video signals. Further, while several embodiments detailed herein describe enhancing the audio signal based on either one or both of a low frequency band and a high frequency band, the scope of the invention is not so limited. The scope of the invention includes but is not limited to enhancing an audio signal in one band as well as in 3 or more bands. In other embodiments, the audio enhancement occurs in one or more low frequency bands, one or more mid bands, and/or one or more high frequency bands. Application of the audio enhancement techniques are expected to be very effective in sharpening an audio track or brightening a sound, etc. In addition, a static equalizer maybe applied to the audio regardless of the transients to provide an additional brightening at both high and low frequencies.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for enhancing an audio signal comprising: monitoring the variation in time of the energy level in at least one frequency band of the audio signal; and applying a dynamic time varying equalizer to the audio signal based on the monitored energy level variations, wherein boosting the level in the frequency band in the dynamic time varying equalizer occurs when a flux value derived from the energy level variations exceeds a predetermined threshold.

2. The method as recited in claim 1 wherein monitoring the energy level variations comprises segmenting the audio signal into a sequence of frames, each frame having at least one sampled value; assigning an energy level for each frame in the sequence; and deriving a flux value corresponding to the variation of the energy level between previous frames and the current frame.

3. The method as recited in claim 2 wherein the frames comprise only one sampled value and an energy level is assigned to each sample.

4. The method as recited in claim 2 wherein the equalizer performs a continuous filtering of the input signal by changing coefficients on a sample by sample basis.

5. The method as recited in claim 2 wherein the sequence of energy levels associated with the frames are used to generate flux values mapped to at least one control signal for controlling the dynamic time varying equalizer filter.

6. The method as recited in claim 5 wherein the at least one control signal comprises a mapped low frequency flux value and a mapped high frequency flux value, the respective mapped flux values used to control a low freq shelving filter and a high freq. shelving filter in the dynamic time varying equalizer filter.

7. The method as recited in claim 5 further comprising combining a sequence of output values from the dynamic time varying equalizer filter using an overlap and add procedure.

8. The method as recited in claim 7 further comprising renormalizing the combined sequence.

9. The method as recited in claim 5 wherein a transfer function representing the mapping between the flux values and the control signal for controlling the dynamic time varying equalizer is a nonlinear function.

10. The method as recited in claim 2 wherein the energy level is determined based on the RMS value of the frame monitored.

11. The method as recited in claim 2 wherein the sequence of frames is generated by using a sampling window, boosting the level in the frequency band in the dynamic time varying equalizer occurs when a flux value derived from the energy level variations exceeds a predetermined threshold, and the output signal from the dynamic time varying equalizer is generated by recombining frames with a synthesis window, the configurations of the sampling window and the synthesis window selected to generate a unity gain when the flux falls below a predetermined threshold.

12. The method as recited in claim 1 wherein the at least one frequency band comprises a low frequency band and a high frequency band.

13. A method for enhancing an audio signal comprising: monitoring the variation in time of the energy level in at least one frequency band of the audio signal; and applying a dynamic time varying equalizer to the audio signal based on the monitored energy level variations wherein the dynamic time varying equalizer comprises at least one shelving filter having coefficient values determined by a mapping process of the monitored energy level variations.

14. A system for enhancing an audio signal comprising: a monitoring device configured to monitor the variation in time of the energy levels in at least one frequency band of the audio signal; and a dynamic time varying equalizer controlled by the monitoring device wherein the monitoring device is configured to segment the audio signal into a sequence of frames, each frame having a plurality of sampled values; assigning an energy level for each frame in the sequence; and deriving a flux value corresponding to the variation of the energy level between previous frames and the current frame and wherein the dynamic time varying equalizer is configured to boost a level in the at least one frequency band when a flux value derived from the energy level variations exceeds a predetermined threshold.

15. The system as recited in claim 14 wherein the dynamic time varying equalizer comprises a low shelf filter and a high shelf filter, and wherein the coefficients for the low shelf filter and the high shelf filter are derived from the flux values.

16. The system for enhancing an audio signal as recited in claim 14 wherein the monitoring device is further configured to monitor a low frequency band of the audio signal and generate a first sequence of flux values responsive to the variation in energy level of the audio signal over time for the low frequency band, monitor a high frequency band of the audio signal and generate a second sequence of flux values responsive to the variation in energy level of the audio signal over time for the high frequency band, generate a low frequency control signal and a high frequency control signal derived respectively from the first and second sequences of flux values; and further comprising: a filtering module having a low shelf filter and a high shelf filter positioned in series to modify the audio signal, the gain for the low shelf filter controlled by the low frequency control signal and the gain for the high shelf filter controlled by the high frequency control signal.

17. The system as recited in claim 16 wherein the filtering module is configured such that it applies a gain to a low frequency band of the audio signal when the first sequence of flux values is responsive to a low frequency transient and applies a gain to a high frequency band of the audio signal when the second sequence of flux values is responsive to a high frequency transient.

18. A method for enhancing an audio signal, the method comprising: segmenting the audio signal into a sequence of frames, each frame having a plurality of sampled values; determining a flux value representing a time variation in the energy levels between a first frame in the sequence and at least one of the preceding frames in the sequence; mapping the flux value to a control signal for control of a filter configured to modify the audio signal; and using the control signal to modify gain characteristics of the filter, such that at least one frequency band of the audio signal is modified when the flux value exceeds a threshold.

19. The method as recited in claim 18 wherein the mapping of the flux value to a control signal comprises determining a sensitivity for the modified gain characteristics based on a user input.

20. The method as recited in claim 18 further comprising increasing a perceived level of loudness of the audio signal by performing at least one of a bass and treble adjustment.

* * * * *